United States Patent [19]
Hagiwara et al.

[11] Patent Number: 5,249,156
[45] Date of Patent: Sep. 28, 1993

[54] SEMICONDUCTOR MEMORY DEVICE HAVING NON-VOLATILE AND VOLATILE MEMORY CELLS

[75] Inventors: Ryoji Hagiwara; Hiromi Kawashima, both of Yokohama, Japan

[73] Assignee: Fujitsu Limited, Kanagawa, Japan

[21] Appl. No.: 732,195

[22] Filed: Jul. 19, 1991

[30] Foreign Application Priority Data

Jul. 20, 1990 [JP] Japan .................................. 2-192096

[51] Int. Cl.[5] .............................................. G11C 8/00
[52] U.S. Cl. ...................................... 365/228; 365/201
[58] Field of Search ............ 365/201, 228, 229, 230.01; 371/21.3

[56] References Cited

U.S. PATENT DOCUMENTS

| 4,538,246 | 8/1985 | Wang et al. | 365/229 |
| 4,651,307 | 3/1987 | Toumayan et al. | 365/228 |
| 4,763,333 | 8/1988 | Byrd | 365/228 |
| 5,113,371 | 5/1992 | Hamada | 365/201 |

Primary Examiner—William L. Sikes
Assistant Examiner—Toan Tran
Attorney, Agent, or Firm—Nikaido, Marmelstein, Murray & Oram

[57] ABSTRACT

A semiconductor memory device includes a memory cell array including a plurality of memory cell parts which are arranged in an array, where each of the memory cell parts are made up of an electrically erasable programmable non-volatile memory cell and a volatile random access memory cell, a mode selection circuit for transferring data stored in the volatile random access memory cell into the electrically erasable programmable non-volatile memory cell for each of the memory cell parts in response to a store signal which specifies a store mode in which the data are stored in the electrically erasable programmable non-volatile memory cell of each of the memory cell parts, and a memory part for storing at least predetermined bits of the external memory address in response to the store signal.

12 Claims, 5 Drawing Sheets

SEMICONDUCTOR MEMORY DEVICE HAVING NON-VOLATILE AND VOLATILE MEMORY CELLS

BACKGROUND OF THE INVENTION

The present invention generally relates to semiconductor memory devices, and more particularly to a semiconductor memory device which has a memory cell in which electrically erasable programmable non-volatile memory cells and volatile random access memory cells are provided with a one-to-one relationship.

In the semiconductor memory device of the type described above, write and read operations are successively carried out with respect to the volatile memory cells during operation of the semiconductor memory device. On the other hand, when stopping the operation of the semiconductor memory device, data stored in the volatile memory cells are transferred and stored into the non-volatile memory cells. When resuming the operation of the semiconductor memory device, the data stored in the non-volatile memory cells are recalled and transferred to the volatile memory cells so that the operation can be resumed from the state before the operation was stopped. By providing one non-volatile memory cell with respect to each volatile memory cell, the storing into the non-volatile memory cell and the recalling to the volatile memory cell can respectively be made simultaneously for each of the memory cells. In other words, the storing and the recalling are respectively made with respect to all of the memory cells in one operation, and not one memory cell at a time. Hence, the time required to make the storing and the recalling within a short time.

FIG. 1 generally shows an example of a conventional semiconductor memory device of the type described above. A memory cell array 10 includes a plurality of memory cell parts, and each memory cell part is provided at an intersection part of a word line WL and a bit line pair BL and $\overline{BL}$. Each memory cell part is made up of a volatile random access memory cell $MC_S$ and an electrically erasable programmable non-volatile memory cell $MC_E$. The memory cell $MC_S$ corresponds to a memory cell of a static random access memory (SRAM), and the memory cell $MC_E$ corresponds to a memory cell of an electrically erasable programmable read only memory (EEPROM). A relatively high voltage $V_{HH}$ on the order of 20 V is required to write data into the memory cell $MC_E$. Hence, a booster circuit 12 is provided to generate this relatively high voltage $V_{HH}$. A timer circuit 14, a store end judging circuit 16 and a mode selection circuit 18 are additionally provided and connected as shown.

A chip select signal $\overline{CS}$, a write enable signal $\overline{WE}$, a store signal $\overline{ST}$ and an array recall signal $\overline{AR}$ are supplied to the mode selection circuit 18. The mode selection circuit 18 supplies the store signal ST to the booster circuit 12, the timer circuit 14 and the end judging circuit 16, and supplies the recall signal AR to a recall control circuit 20. The recall control circuit 20 supplies a recall control signal ARC to the memory cell $MC_E$, and also supplies a control signal to a power source switch VccSW in a recall mode.

A memory access address is made up of a plurality of bits. Predetermined bits Ai of the memory access address are supplied to an address buffer 24, while remaining bits Aj of the memory access address are supplied to an address buffer 26. The predetermined bits Ai are supplied from the address buffer 24 to an X-decoder 28 which selects a word line. On the other hand, the remaining bits Aj are supplied from the address buffer 26 to a Y-decoder 30 which selects a gate of a Y-gate (or column gate) 32. Data read out from the memory cell array 10 is selected at the Y-gate 32 and is amplified in a sense amplifier 34. An output of the sense amplifier 34 is supplied to a buffer 36 which outputs a read data DO. On the other hand, a write data DI is supplied to the memory cell array 10 via a buffer 38 and the Y-gate 32, and is written into the memory cell parts selected by the word line, similarly as in the case of a normal memory device.

FIG. 2 shows an example of the memory cell part which is made up of the memory cells $MC_S$ and $MC_E$. The memory cell $MC_S$ is a flip-flop, similarly as in the case of a memory cell of the normal SRAM. In this case, the memory cell $MC_S$ includes depletion type MOS transistors $TD_1$ and $TD_2$ which are used as loads and enhancement type MOS transistors $TE_1$ and $TE_2$ which are used as drivers. Transistors $TE_3$ and $TE_4$ are used as transfer gates and couple the memory cell $MC_S$ to the bit line pair BL and $\overline{BL}$.

On the other hand, the memory cell $MC_E$ is shown in FIG. 2 as an equivalent circuit which includes capacitors $CT_1$ through $CT_3$ and $CT_N$. A node $N_5$ which corresponds to a floating gate FG is connected to a gate of a transistor $T_M$. Lines $1_1$ and $1_2$ for coupling the memory cell $MC_E$ to the memory cell $MC_S$ are respectively connected to nodes $N_1$ and $N_2$ of the memory cell $MC_S$. The transistor $T_M$ is connected to the line $1_2$ together with a transistor $T_A$ which receives the recall control signal ARC. The lines $1_1$ and $1_2$ are respectively connected to gates of transistors $T_1$ and $T_2$. The line $1_1$ is grounded via a capacitor $CT_O$, while the line $1_2$ is grounded via the transistors $T_A$ and $T_M$.

The write and read operation with respect to the memory cell $MC_S$ is carried out similarly as in the case of the normal SRAM.

In a store mode in which the data stored in the memory cell $MC_S$ is stored into the memory cell $MC_E$, the mode selection circuit 18 outputs the store signal ST. For example, it is assumed for the sake of convenience that the data "0" is stored in the memory cell $MC_S$, and that the signal levels at the nodes $N_1$ and $N_2$ respectively are high (5 V) and low (0 V). In this case, the transistor $T_1$ is ON, the transistor $T_2$ is OFF, and the potential at a node $N_3$ of the memory cell $MC_E$ is the ground potential. Because the booster circuit 12 generates the relatively high voltage $V_{HH}$ in response to the store signal ST, the capacitor $CT_1$ of the memory cell $MC_E$ is charged to the voltage $V_{HH}$, and the three capacitors $CT_3$, $CT_N$ and $CT_2$ receive the voltage $V_{HH}$ in the series-connected state. In this case, the booster circuit 12 generates a voltage $V_{HH}$ of 20 V in response to four clocks. The capacitor $CT_N$ has a tunneling layer, and the floating gate FG (node $N_5$) has a positive potential since there is input and output of charge through the tunneling layer. Hence, data "0" is stored in the memory cell $MC_E$ in this state, and the transistor $T_M$ is ON.

On the other hand, when the data "1" is stored in the memory cell $MC_S$ and the potentials at the nodes $N_1$ and $N_2$ respectively are low and high, the transistor $T_1$ is OFF and the transistor $T_2$ is ON. Thus, a node $N_4$ of the memory cell $MC_E$ has the ground potential. In this case, the capacitor $CT_3$ is charged to the volta $V_{HH}$, and the three capacitors $CT_1$, $CT_2$ and $CT_N$ receive the voltage $V_{HH}$ in the series-connected state. The floating gate FG (node $N_5$) has a negative potential. Accordingly, data "1" is stored in the memory cell $MC_E$ in this state, and the transistor $T_M$ is OFF.

In a recall mode in which the data stored in the memory cell $MC_E$ is recalled and stored into the memory cell $MC_S$, the mode selection circuit 18 outputs the recall signal AR. The recall control circuit 20 outputs a high-level recall control signal ARC in response to the recall signal AR. The transistor $T_A$ turns ON in response to the high-level recall control signal ARC. Since the transistor $T_M$ is ON if the data "0" is stored in the memory cell $MC_E$, the potential at the node $N_2$ of the memory cell $MC_S$ is lowered to the ground potential via the transistors $T_A$ and $T_M$, and the node $N_1$ is grounded via the capacitor $CT_O$. Consequently, the potentials at the nodes $N_1$ and $N_2$ respectively become high and low as a power source voltage Vcc of the memory cell $MC_S$ is raised, and the transistor $TE_2$ turns ON and the transistor $TE_1$ turns OFF. As a result, the memory cell $MC_S$ is returned to the original state in which the data "0" is stored in the memory cell $MC_S$.

The transistor $T_M$ is OFF if the data "1" is stored in the memory cell $MC_E$, the potential at the node $N_2$ of the memory cell $MC_S$ is raised as the power source voltage Vcc is raised, and the potential rise at the node $N_1$ is delayed by the provision of the capacitor $CT_O$. Accordingly, the potentials at the nodes $N_2$ and $N_1$ respectively become high and low, and the transistor $TE_1$ turns ON and the transistor $TE_2$ turns OFF. As a result, the memory cell $MC_S$ is returned to the original state in which the data "1" is stored in the memory cell $MC_S$.

When the mode selection circuit 18 outputs the store signal ST in response to the external store signal $\overline{ST}$ or outputs the recall signal AR in response to the external recall signal $\overline{AR}$, the store or recall operation is made for all of the memory cells of the memory cell array 10. For this reason, the storing of the data into the memory cells $MC_E$ and the recalling of the data into the memory cells $MC_S$ can be made within a short time.

The semiconductor memory device of the type described above does not have an extremely large memory capacity. For example, the memory capacity is 256×4 bits. In addition, the store end judging circuit 16 shown in FIG. 1 monitors the generation of a pulse which is used to generate the voltage $V_{HH}$, and the end of the store operation is detected when four such pulses are generated.

The semiconductor memory device of the type described above is sometimes referred to as a non-volatile RAM (NVRAM). And in such NVRAMs, a noise which is generated when the power source is turned ON/OFF, a skew of the signal when the mode of the NVRAM is switched and the like may cause an erroneous store operation.

In EPROMs, the operator does not need to make a special operation such as applying a high voltage to terminal pins of the EPROM when carrying out a write operation, and for this reason, an erroneous write operation is unlikely to occur. On the other hand, in NVRAMs, once the store signal $\overline{ST}$ is supplied to the mode selection circuit 18, operations such as raising the internal voltage are carried out automatically and the store operation is carried out to store the data into the memory cells $MC_E$. The pulse width of the store signal $\overline{ST}$ is on the order of nano-seconds (ns), and a noise may be mistaken as the store signal $\overline{ST}$. When the noise is mistaken as the store signal $\overline{ST}$, the store operation is carried out automatically in error. A similar situation occurs when a noise is mistaken as the recall signal $\overline{AR}$ and the recall operation is automatically carried out in error. However, problems occur if the operator is not aware of such erroneous store and recall operations which are carried out naturally in error.

As measures against the erroneous store and recall operations, two methods are conceivable.

According to a first method, a power source monitoring circuit is provided within the chip of the NVRAM. The power source voltage is normally 5 V, and the circuits of the NVRAM will not operate correctly if the power source voltage becomes 3 V or less. An erroneous output signal may be generated when the circuits of the NVRAM do not operate correctly, and this erroneous output signal may be mistaken as the store or recall signal $\overline{ST}$/e,ovs/AR/ . Hence, the first method monitors the power source voltage by the power source monitoring circuit and prohibits the store or recall operation when the power source voltage becomes 3 V or less.

On the other hand, a reject circuit is provided to prevent the NVRAM from operating in response to signals having narrow pulse widths. Generally, the noise has a narrow pulse width. Hence, the second method rejects signals which have pulse width less than a predetermined pulse width by the reject circuit and recognizes the signal as the store or recall signal $\overline{ST}/\overline{AR}$ only when the pulse width of the signal is greater than or equal to the predetermined pulse width.

However, the first and second methods described above cannot prevent all erroneous store and recall operations.

When the erroneous store operation does occur, this causes data error in the NVRAM because the erroneous store operation is carried out simultaneously with respect to all bits. But data error also occurs when defective memory cells exist in the NVRAM. Accordingly, it is impossible to distinguish the data error caused by the erroneous store operation from the data error caused by the defective memory cells.

But when a data processing system fails and it is detected that the failure originates from the memory device, for example, the method used to remove the failure is different depending on whether the data error is caused by the erroneous store operation or by the defective memory cells. In the case of the EPROM, the write operation is carried out by applying a relatively high voltage to the EPROM, and it is always possible to know that the data was intentionally written by the operator since the write operation would not be carried out unless the relatively high voltage is applied. However, in the case of the NVRAM, it is unclear whether the data was intentionally stored or stored naturally in error.

Therefore, there is a demand to realize an NVRAM in which it is possible to determine whether the data was stored intentionally or written naturally in error.

SUMMARY OF THE INVENTION

Accordingly, it is a general object of the present invention to provide a novel and useful semiconductor memory device in which the problems described above are eliminated and the above described demand is satisfied.

Another and more specific object of the present invention is to provide a semiconductor memory device comprising input means for receiving an external memory address, a memory cell array including a plurality of memory cell parts which are arranged in an array, where each of the memory cell parts are made up of an electrically erasable programmable non-volatile memory cell and a volatile random access memory cell, mode selection means coupled to the memory cell array for transferring data stored in the volatile random access memory cell into the electrically erasable programmable non-volatile memory cell for each of the memory cell parts in response to a store signal which specifies a store mode in which the data are stored in the electrically erasable programmable non-volatile memory cell of each of the memory cell parts, and memory means coupled to the input means for storing at least predetermined bits of the external memory address in response to the store signal. According to the semiconductor memory device of the present invention, it is possible to judge from the address stored in the memory means whether the store operation was carried out intentionally or the store operation was naturally carried out in error due to a noise or the like.

Other objects and further features of the present invention will be apparent from the following detailed description when read in conjunction with the accompanying drawings.

DESCRIPTION OF THE PREFERRED EMBODIMENTS

Figure 3:
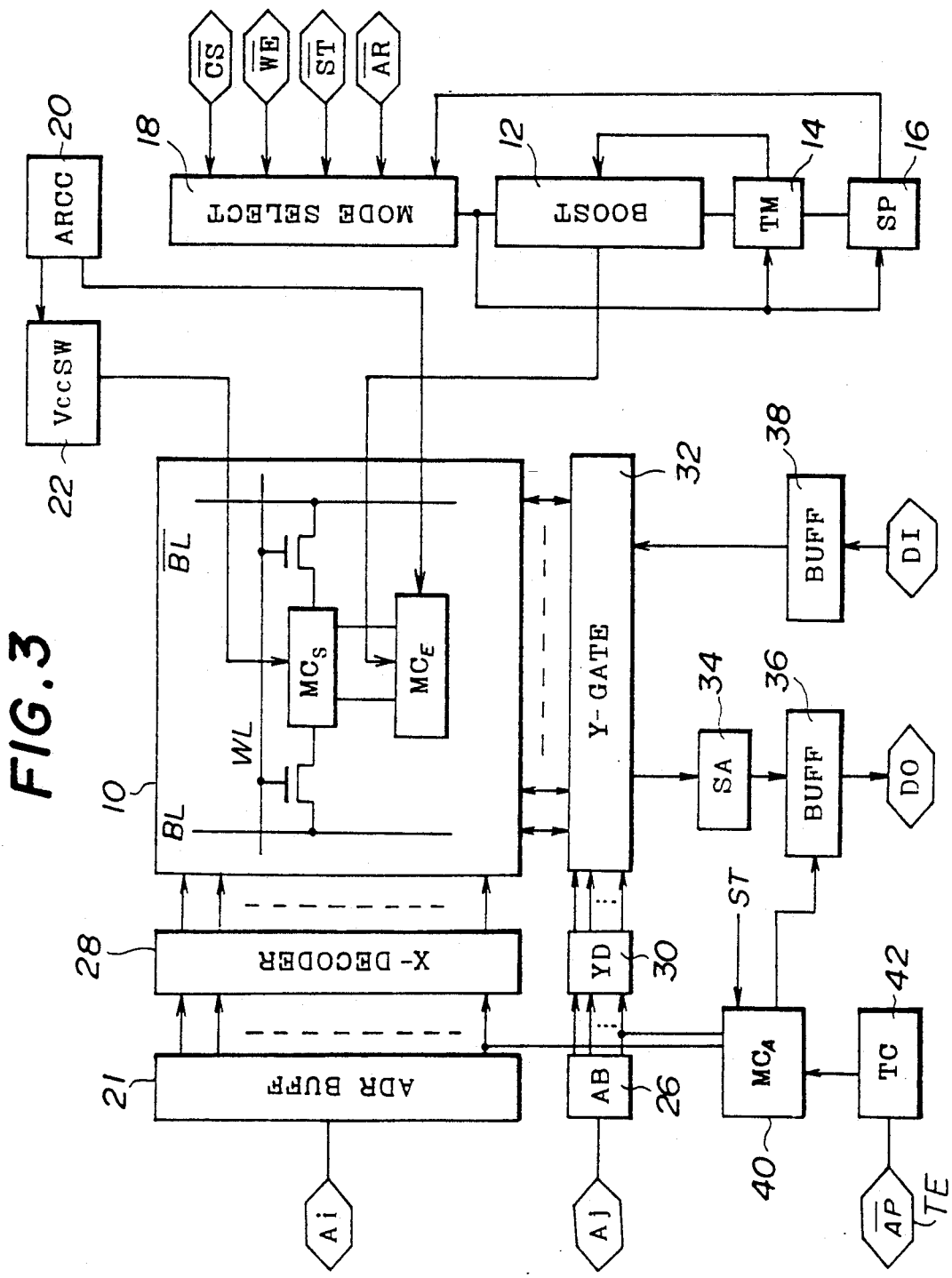
FIG. 3 is a system block diagram generally showing an embodiment of a semiconductor memory device according to the present invention.

FIG. 3 generally shows an embodiment of a semiconductor memory device according to the present invention. In FIG. 3, those parts which are the same as those corresponding parts in FIG. 1 are designated by the same reference numerals, and a description thereof will be omitted.

Figure 1:
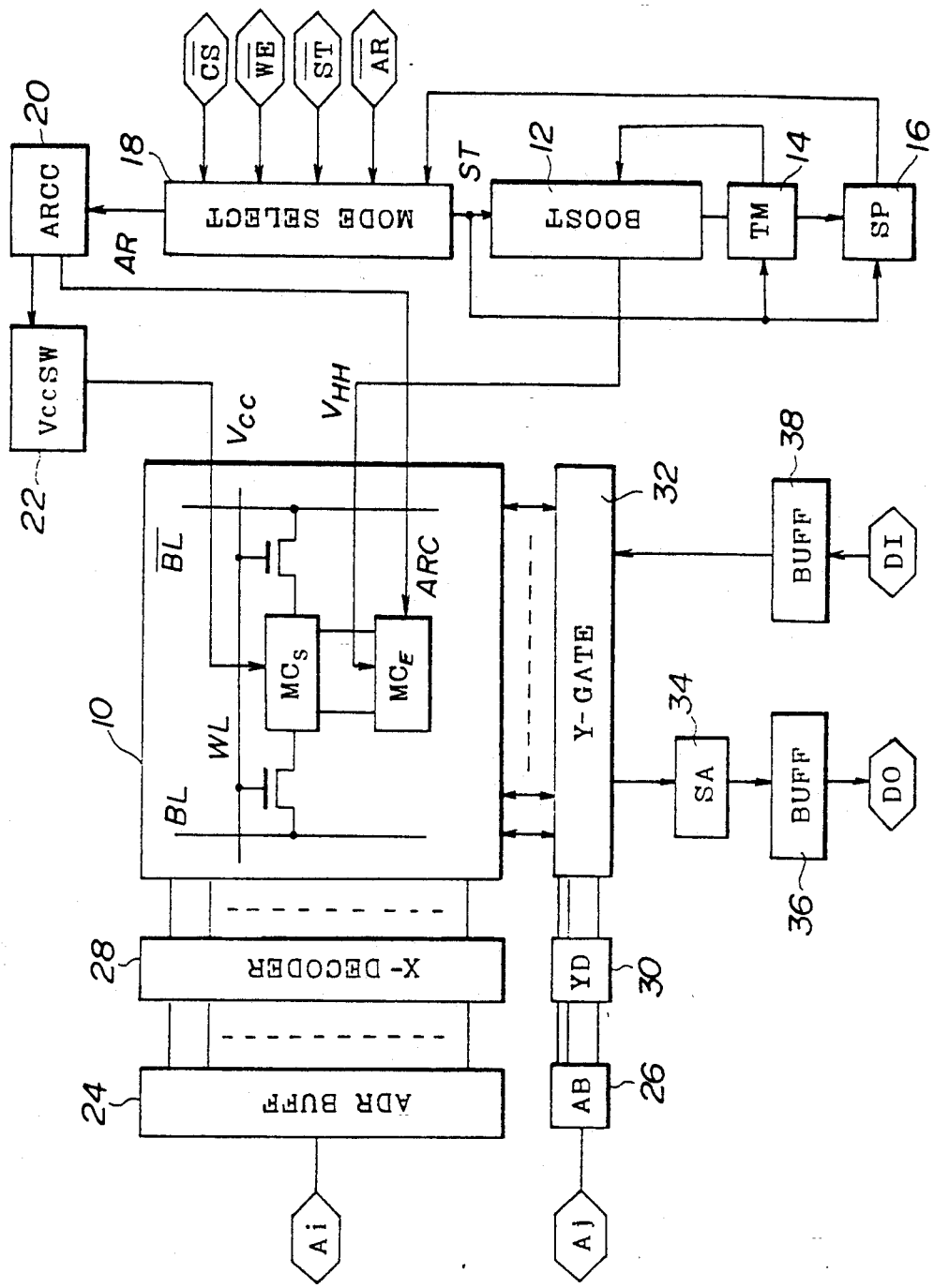
FIG. 1 is a system block diagram generally showing an example of a conventional semiconductor memory device.
Figure 2:
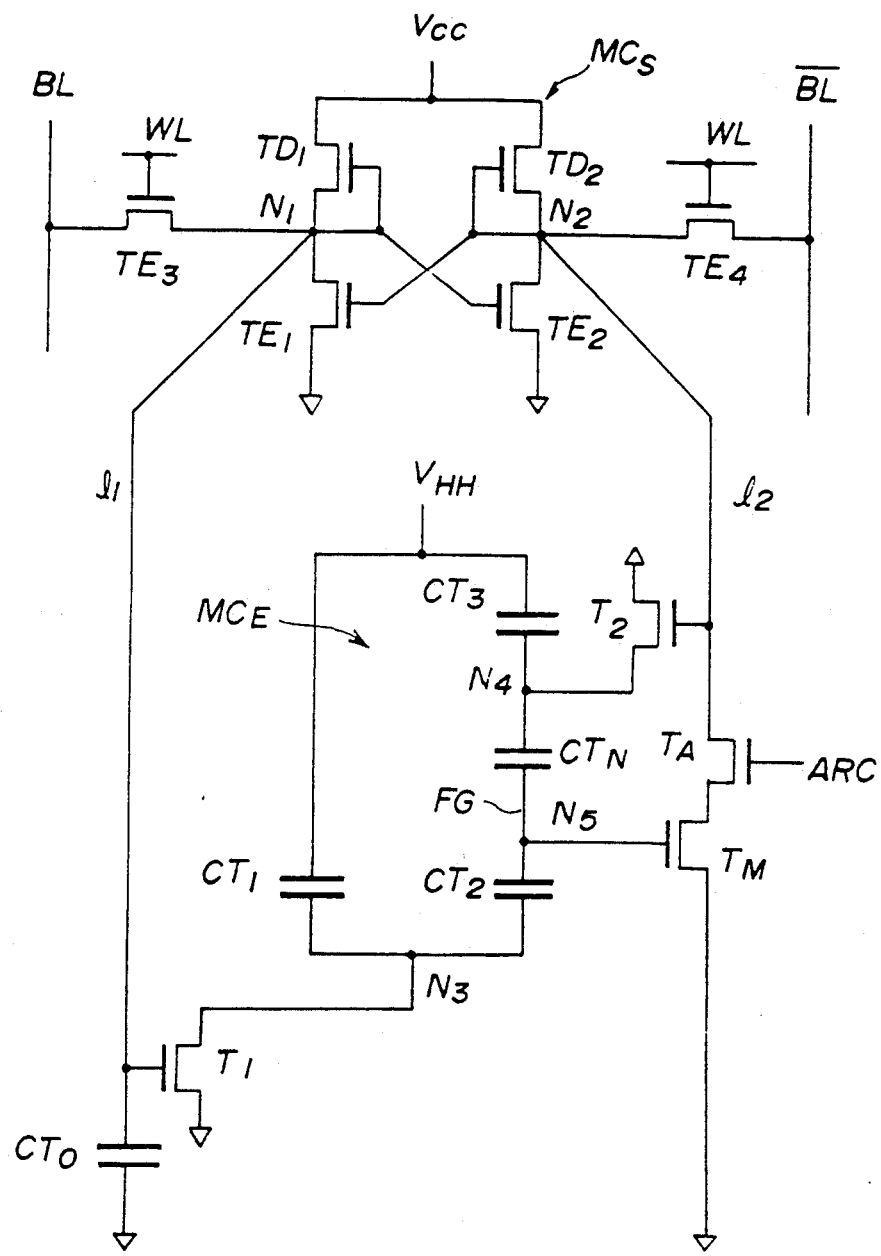
FIG. 2 is a circuit diagram showing a memory cell part of the conventional semiconductor memory device shown in FIG. 1.

In this embodiment, a memory means 40 and a test circuit 42 are provided in addition to the elements shown in FIG. 1. The memory means 40 stores a memory address at the time when the store operation is made. Preferably, the memory means 40 stores all bits of the memory address. However, for the sake of convenience, it will be assumed in this embodiment that only the column address is stored in the memory means 40. The memory address stored in the memory means 40 is read out when needed, and the test circuit 42 controls the read operation of the memory means 40.

For example, the memory means 40 is made up of non-volatile electrically erasable programmable memory cells. Preferably, the memory cells of the memory means 40 are of the same kind as those used in the memory cell array 10, because this would simplify the structure of the semiconductor memory device. The memory address stored in the memory means 40 is not read out constantly, and is only read out when needed. Normally, writing of the memory address into the memory means 40 is repeated for every store operation. The reading of the memory address from the memory means 40 is triggered by a special operation which does not occur during the normal memory access, such as applying a relatively high voltage to a predetermined terminal pin of the semiconductor memory device. In this embodiment, the memory address which is read out from the memory means 40 is output from a data output terminal DO via the buffer 36. The data output terminal DO is the terminal from which the read data DO from the memory cell array 10 is output.

By storing the memory address into the memory means 40 at the time when the store operation is made, it becomes possible to basically distinguish whether the store operation was carried out intentionally or naturally in error due to a noise or the like.

In other words, in the semiconductor memory device of this type (that is, the NVRAM) the store operation is normally carried out before stopping the operation of the semiconductor memory device. The operation of the semiconductor memory device is stopped when turning OFF the power source to stop the operation of a data processing system which uses the semiconductor memory device, for example. For this reason, no memory access is made to the semiconductor memory device when the store operation is carried out, and thus, the memory address is in most cases fixed to a predetermined state. All the bits of the memory address are usually "0" or "1" in the predetermined state in order to reduce the burden on the data processing system because the all-"0" or all-"1" memory address is easy to generate. Therefore, when the memory address stored in the memory means 40 is in the predetermined state, it is safe to assume that the store operation was carried out intentionally.

On the other hand, when the store operation is naturally carried out in error due to a noise or the like, a memory access may be made to the semiconductor memory device or the parts of the semiconductor memory device may not operate correctly. In any case, the memory address is therefore random when the store operation is naturally carried out in error. Therefore, it is safe to assume that the store operation was naturally carried out in error when the memory address stored in the memory means 40 is not in the predetermined state but is at random.

Accordingly, by storing the memory address into the memory means 40 at the time when the store operation is carried out, it is possible to read out the stored memory address from the memory means 40 when the data processing system fails and it is detected that the failure originates from the semiconductor memory device. From the read out memory address, it is possible to determine whether or not the store operation was carried out intentionally, and a most appropriate method may be used quickly to remove the failure depending on whether the data error is caused by the erroneous store operation or by the defective memory cells.

Figure 4:
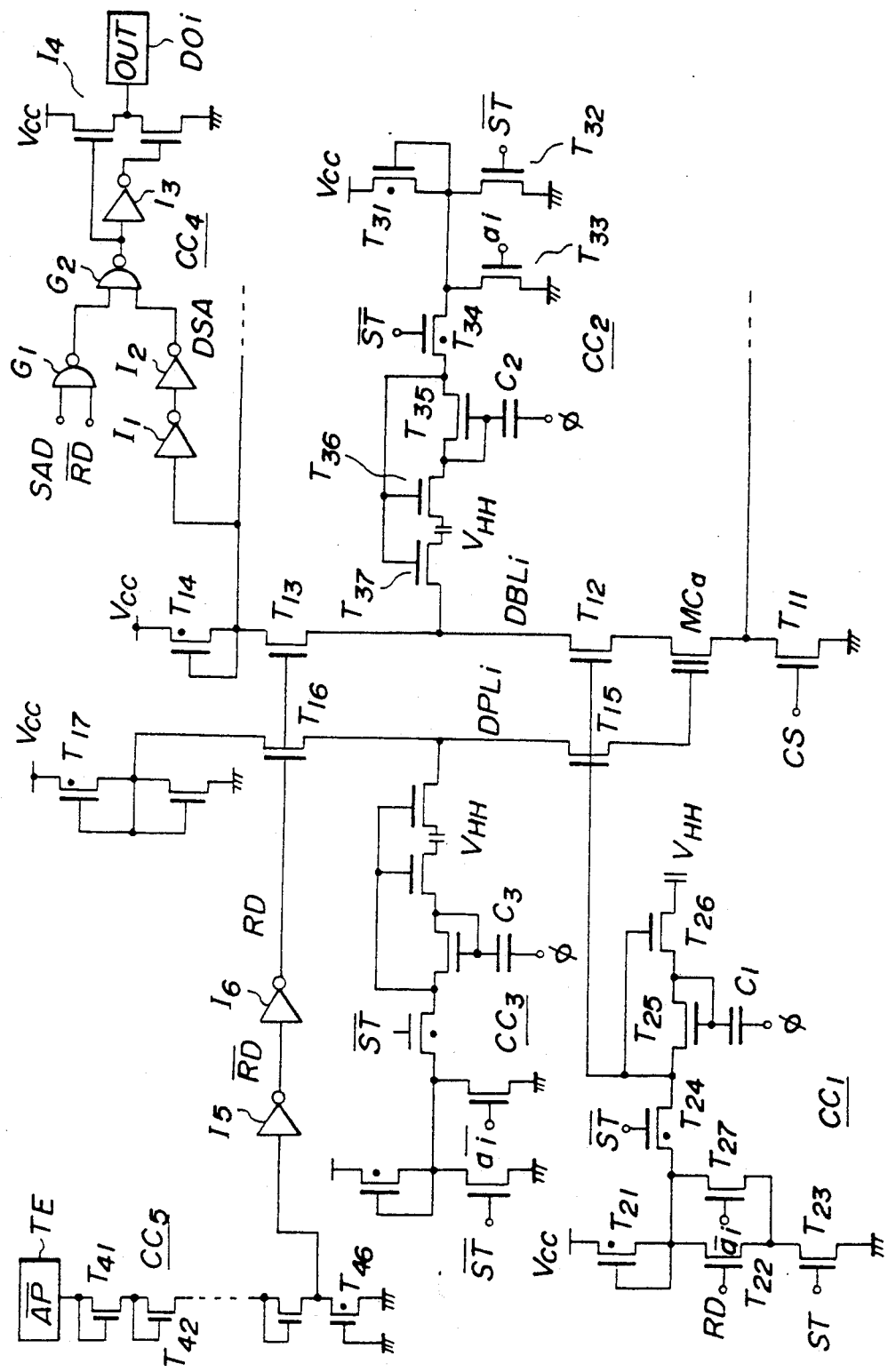
FIG. 4 is a circuit diagram showing an essential part of the embodiment shown in FIG. 3.

FIG. 4 shows an essential part of the embodiment including the memory means 40 and the test circuit 42. FIG. 4 shows only one memory cell $MC_a$ of the memory means 40 for storing one bit of the memory address. As described above, it is assumed that the memory means 40 stores the column address. In actual practice, the number of memory cells $MC_a$ provided corresponds to the number of bits of the memory address to be stored in the memory means 40.

The memory cell $MC_a$ is an EEPROM cell, and the source/drain of the transistor which forms the memory cell $MC_a$ is coupled to a line DBLi (i=1, 2, 3, ...). This line DBLi is grounded via a transistor $T_{11}$ which is controlled by a signal CS. Transistors $T_{12}$ and $T_{13}$ are coupled to the power source Vcc via a transistor $T_{14}$ which functions as a load resistor. The gate of the transistor which forms the memory cell $MC_a$ is coupled to a line DPLi (i=1, 2, 3, ...). This line DPLi is coupled to the power source Vcc via transistors $T_{15}$ and $T_{16}$ and a transistor $T_{17}$ which functions as a load resistor.

A circuit $CC_1$ includes transistors $T_{21}$ through $T_{26}$ and a capacitor $C_1$ which are connected as shown, and is used to control the transistors $T_{12}$ and $T_{15}$. A signal RD which is output from an inverter $I_6$ normally has a low level. In this case, the transistor $T_{22}$ is OFF, and the transistor $T_{23}$ is ON because the store signal ST has a high level in the store mode. Accordingly, when the memory address Ai is supplied to the semiconductor memory device and an inverted internal address $\overline{ai}$ has a low level, the transistor $T_{27}$ is OFF and the transistors $T_{12}$ and $T_{15}$ are ON. An internal address ai is the memory address generated within the semiconductor memory device and is substantially the same as the memory address Ai which is supplied to the semiconductor memory device from outside the semiconductor memory device. The internal address ai has the same phase as the memory address Ai. The internal address ai will hereinafter be referred to as the address bit ai because only one memory cell MCa and parts related thereto are shown in FIG. 4. The gates of the transistors $T_{12}$ and $T_{15}$ are raised to a potential greater than or equal to the relatively high voltage $V_{HH}$ when a clock $\phi$ rises, due to a boost action of the transistors $T_{25}$ and $T_{26}$ and the capacitor $C_1$. For an address bit other than the address bit ai, the transistor $T_{27}$ turns ON and the transistor $T_{12}$ turns OFF.

A circuit $CC_2$ includes transistors $T_{31}$ through $T_{37}$ and a capacitor $C_2$ which are connected as shown, and is used to supply the voltage $V_{HH}$ to the line DBLi. In the store mode, the transistor $T_{32}$ is OFF, and the transistor $T_{33}$ is ON if the address bit ai is high and is OFF if the address bit ai is low. Hence, the transistor $T_{37}$ turns ON when the address bit ai is low, and the gate of the transistor $T_{37}$ is raised to a potential greater than or equal to the voltage $V_{HH}$ when the clock $\phi$ rises, due to the boost action of the transistors $T_{35}$ and $T_{36}$ and the capacitor $C_2$. As a result, the voltage $V_{HH}$ is supplied to the line DBLi. On the other hand, when the address bit ai is high, the transistor $T_{33}$ is ON and the transistors $T_{36}$ and $T_{37}$ are OFF. Thus, in this case, the voltage $V_{HH}$ will not be supplied to the line BDLi.

The structure and operation of a circuit $CC_3$ are similar to those of the circuit $CC_2$. However, the circuit $CC_3$ receives an inverted address bit $\overline{ai}$ and not the address bit ai. The circuit $CC_3$ supplies the voltage $V_{HH}$ to the line DPLi when the inverted address bit $\overline{ai}$ is low in the store mode, and does not supply the voltage $V_{HH}$ to the line DPLi when the inverted address bit $\overline{ai}$ is high in the store mode. Accordingly, the line DPLi has a high level ($V_{HH}$) when the address bit ai is high but has a low level when the address bit ai is low.

Therefore, the transistor which forms the memory cell MCa receives the voltage $V_{HH}$ at the gate and the ground potential at the drain when the inverted address bit $\overline{ai}$ is low or the address bit ai is high, and electrons are injected to the floating gate FG. As a result, the threshold voltage of the transistor which forms the memory cell MCa increases, and this transistor is OFF even when the power source voltage Vcc is applied thereto.

On the other hand, when the inverted address bit $\overline{ai}$ is high or the address bit ai is low, the line DBLi has a high level and the line DPLi has a low level. Consequently, the electrons at the floating gate FG escape and the threshold voltage of the transistor which forms the memory cell MCa returns to the original value. Hence, this transistor turns ON when the power source voltage Vcc is applied thereto.

The high and low levels ("1" and "0") of the address bit ai is stored in the memory cell MCa in the above described manner. In addition, the above described operation is similarly carried out for all of the address bits ai, where i=1, 2, 3, ....

A circuit $CC_4$ includes NAND gates $G_1$ and $G_2$ and inverters $I_1$ through $I_4$ which are connected as shown, and is used to read the store address bit ai from the memory cell MCa. This circuit $CC_4$ includes a part of the buffer 36 shown in FIG. 3.

A circuit $CC_5$ corresponds to the test circuit 42 shown in FIG. 3, and includes transistors $T_{41}$, $T_{42}$, ..., $T_{46}$ and inverters $I_5$ and $I_6$ which are connected as shown. The transistors $T_{41}$, $T_{42}$, ... are connected to function as diodes.

When a voltage $\overline{AP}$ which is relatively high compared to the power source voltage Vcc is applied to a terminal TE, the transistors $T_{41}$, $T_{42}$, ... turn ON and the level of an output signal $\overline{RD}$ of the inverter $I_5$ becomes low and the level of the output signal RD of the inverter $I_6$ becomes high. For example, the voltage $\overline{AP}$ is 12 V as opposed to the power source voltage Vcc which is 5 V. In this case, the transistors $T_{13}$ and $T_{16}$ turn ON, and the transistors $T_{12}$ and $T_{15}$ turn ON because the store signal $\overline{ST}$ has a high level when the mode is not the store mode. As a result, the power source voltage Vcc is applied to the drain and the gate of the transistor which forms the memory cell MCa, and a current flows through this transistor when this transistor is ON but no current flows when this transistor is OFF.

A voltage drop occurs at the load transistor $T_{14}$ when a current flows in the line DBLi, but no voltage drop occurs when no current flows in the line DBLi. The level at the line DBLi is low when the current flows therein and is high when no current flows therein. The signal on the line DBLi is transferred to the NAND gate $G_2$ via the inverters $I_1$ and $I_2$, and the signal which is inverted at the NAND gate $G_2$ is further inverted by the inverter $I_4$ before being output to the read data output terminal DOi. A read data SAD which is read out from the memory cell array 10 is supplied to the NAND gate $G_1$ together with the signal $\overline{RD}$, and the read data SAD is supplied to the read data output terminal DOi via the NAND gates $G_1$ and $G_2$ and the inverters I3 and I4. In an address reading mode in which the voltage $\overline{AP}$ is applied to the terminal TE to read the stored address bit ai from the memory cell MCa, the signal $\overline{RD}$ has a low level and the read data SAD is blocked by the NAND gate $G_1$ which is closed. But during a normal operation of the semiconductor memory device, the signal $\overline{RD}$ has a high level and the NAND gate $G_1$ is open. Hence, the read data SAD is output from the read data output terminal DOi as the read data DO.

Figure 5:
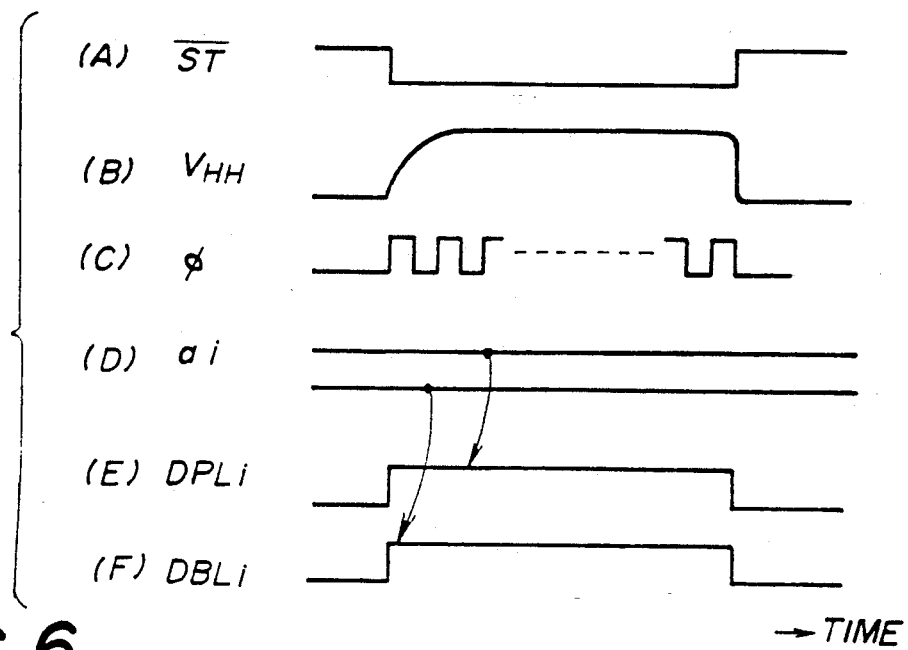
FIG. 5 is a timing chart for explaining a write operation with respect to memory means of the embodiment.
Figure 6:
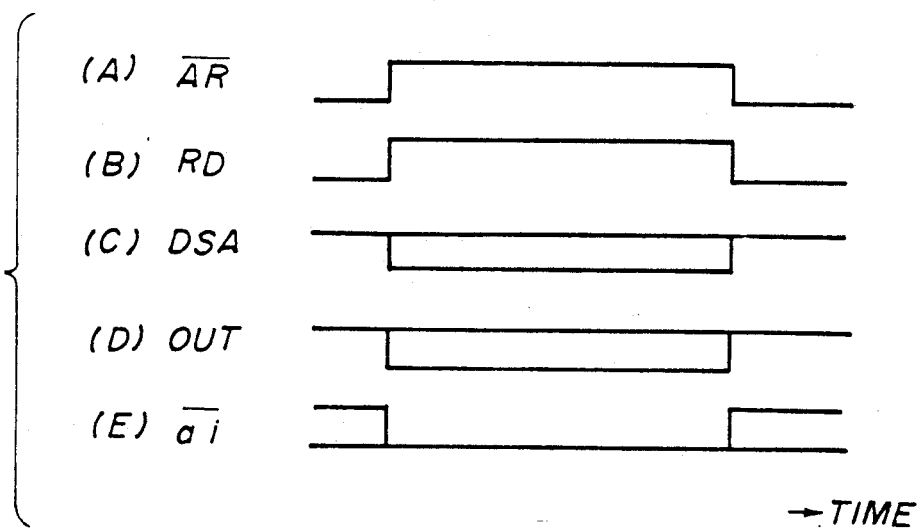
FIG. 6 is a timing chart for explaining a read operation with respect to memory means of the embodiment.

FIG. 5 shows a timing chart for explaining a write operation with respect to the memory means 40 of this embodiment which is carried out in the store mode, and FIG. 6 is a timing chart for explaining a read operation with respect to the memory means 40 of this embodiment. In FIG. 5, (A) shows the store signal $\overline{ST}$, (B) shows the voltage $V_{HH}$, (C) shows the clock $\phi$, (D) shows the address bit ai, (E) shows the signal level at the line DPLi, and (F) shows the signal level at the line DBLi. On the other hand, in FIG. 6, (A) shows the recall signal $\overline{AR}$, (B) shows the signal RD, (C) shows a read output DSA of the memory cell MCa, (D) shows a signal OUT which is output from the read data output terminal DOi, and (E) shows the inverted address bit $\overline{ai}$.

In FIG.5, when the level of the store signal $\overline{ST}$ becomes low, the relatively high voltage $V_{HH}$ is generated and the clock $\phi$ is generated in response to this voltage $V_{HH}$. Hence, the signal levels at the lines DPLi and DBLi respectively become high and low when the address bit ai has a high level, and the signal levels at the lines DPLi and DBLi respectively become low and high when the address bit ai has a low level.

In FIG. 6, when the relatively high voltage AR of 12 V, for example, is applied to the terminal TE, the level of the signal RD becomes high. Hence, the level of the read output DSA of the memory cell MCa becomes high when the transistor forming the memory cell MCa is OFF but becomes low when this transistor is ON. The read output DSA is output from the read data output terminal DOi as the signal OUT via the NAND gate G₂ and the inverters I₃ and I₄. During this read operation, the inverted address bit $\overline{ai}$ has a low level.

In this embodiment, there are four output terminals DO to provide a simultaneous output of four bits. In addition, since the column address is also four bits, the memory means 40 stores the four bits of the column address during the write operation, and these four bits are output from the four output terminals DO during the read operation. But as described before, it is preferable to write all bits of the memory address in the memory means 40. In this case, the address bits read from the memory means 40 during the read operation may be output successively via the output terminals DO or via address terminals. It is preferable to use existing terminal pins to output the data read out from the memory means 40, but it is of course possible to provide terminal pins exclusively for outputting the data read out from the memory means 40.

Further, the present invention is not limited to these embodiments, but various variations and modifications may be made without departing from the scope of the present invention.

What is claimed is:

1. A semiconductor memory device comprising:
    input means for receiving an external memory address;
    a memory cell array, coupled to said input means, including a plurality of memory cell parts which are arranged in an array, each of said memory cell parts being made up of an electrically erasable programmable non-volatile memory cell and a volatile random access memory cell;
    mode selection means, coupled to said memory cell array, for allowing data stored in the volatile random access memory cell to be transferred into the electrically erasable programmable non-volatile memory cell for each of the memory cell parts in response to a store signal which specifies a store mode in which the data are stored in the electrically erasable programmable non-volatile memory cell of each of the memory cell parts; and
    memory means, coupled to said input means, for storing at least predetermined bits of the external memory address in response to the store signal.

2. The semiconductor memory device as claimed in claim 1, wherein said memory means stores all bits of the external memory address.

3. The semiconductor memory device as claimed in claim 1, wherein said memory means includes memory cells for storing the bits of the external memory address, said memory cells of said memory cells being identical to the electrically erasable programmable non-volatile memory cells of the memory means parts within said memory cell array.

4. The semiconductor memory device as claimed in claim 1, which further comprises test circuit means, coupled to said memory means, for reading the stored address bits from said memory means in response to a predetermined signal.

5. The semiconductor memory device as claimed in claim 4, wherein said memory cell array includes word lines and bit line pairs, each of said memory cell parts being coupled to a corresponding one of the word lines and a corresponding one of the bit line pairs, and said semiconductor memory device further comprises decoding means coupled to said input means and said memory cell array for selecting the memory cell parts of said memory cell array in response to the external memory address, and output means coupled to said memory cell array for outputting data read out from the memory cell parts of said memory cell array.

6. The semiconductor memory device as claimed in claim 5, wherein the address bits read out from said memory means are output via said output means.

7. The semiconductor memory device as claimed in claim 4, wherein said predetermined signal occurs only during a mode other than a mode in which a memory access is made to said memory cell array.

8. The semiconductor memory device as claimed in claim 4, wherein said predetermined signal has a voltage higher than a power source voltage used within the semiconductor memory device.

9. The semiconductor memory device as claimed in claim 1, wherein the external memory address has a predetermined bit pattern during the store mode.

10. The semiconductor memory device as claimed in claim 9, wherein said predetermined bit pattern has the same value for all bits of the external memory address.

11. The semiconductor memory device as claimed in claim 1, wherein said mode selection means transfers the data stored in the electrically erasable programmable non-volatile memory cell to the volatile random access memory cell for each of the memory cell parts of said memory cell array in response to a recall signal which specifies a recall mode in which the data are recalled to the volatile random access memory cell of each of the memory cell parts.

12. The semiconductor memory device as claimed in claim 1, wherein said memory cell array includes word lines and bit line pairs, each of said memory cell parts being coupled to a corresponding one of the word lines and a corresponding one of the bit line pairs, and said semiconductor memory device further comprises decoding means coupled to said input means and said memory cell array for selecting the memory cell parts of said memory cell array in response to the external memory address, and output means coupled to said memory cell array for outputting data read out from the memory cell parts of said memory cell array.

* * * * *